(12) United States Patent
Melcher

(10) Patent No.: US 6,218,805 B1
(45) Date of Patent: Apr. 17, 2001

(54) MEASURING BATTERY CLAMPS

(75) Inventor: Domenic Melcher, Uster (CH)

(73) Assignee: Menico AG, Uster (CH)

( * ) Notice: Subject to any disclaimer, the term of this patent is extended or adjusted under 35 U.S.C. 154(b) by 0 days.

(21) Appl. No.: 09/446,177

(22) PCT Filed: Feb. 22, 1999

(86) PCT No.: PCT/CH99/00085

§ 371 Date: May 5, 2000

§ 102(e) Date: May 5, 2000

(87) PCT Pub. No.: WO99/54744

PCT Pub. Date: Oct. 28, 1999

(30) Foreign Application Priority Data

Apr. 17, 1998 (CH) .................................................... 882/98

(51) Int. Cl.$^7$ .................................................. H01M 10/46
(52) U.S. Cl. ............................................................ 320/105
(58) Field of Search .................................. 320/103, 104, 320/105, 107, 111, 113, 115, 150

(56) References Cited

U.S. PATENT DOCUMENTS 4,675,255 * 6/1987 Krappel et al. .
5,700,089 * 12/1997 McKinnon .
5,877,563 * 3/1999 Pfeifer et al. .

FOREIGN PATENT DOCUMENTS

725412 * 8/1996 (EP) .
WO 90/02432 * 3/1990 (WO) .

* cited by examiner

*Primary Examiner*—Edward H. Tso
(74) *Attorney, Agent, or Firm*—Jenkens & Gilchrist, P.C.

(57) ABSTRACT

A measuring battery clamp (1) with a fastening sleeve (2), with which it is firmly fixed to the positive pole connector (9) of a rechargeable battery (42) both thermally and electrically conducting, includes in its interior sensors (14, 21, 40), as well as means (16, 32, 33, 34) to process the signals generated by the sensors and to prepare them for passing on by means of a two-wire data line (13) to matching indicator units (28, 29). For the energy supply to the sensors (14, 21, 40) and to these means (16, 32, 33, 34), the measuring battery clamp (1) is also connected to the negative pole connector (47) of the battery (42) via a battery cable (12).

With the smallest installation outlay it is possible to bring to display various quantities relating to the battery, such as temperature, voltage, current, power or ampere-hour count on indicator units (28, 29) as well as being used to optimize the battery use during charging and discharging.

15 Claims, 3 Drawing Sheets

MEASURING BATTERY CLAMPS

BACKGROUND OF THE INVENTION

1. Field of the Invention

The present invention relates to electrical direct current systems with batteries, which find application for the storage and delivery of electrical energy in the most diverse applications, for instance in land, air or water vehicles, especially as auxiliary energy sources for starting a main motor, or as storage elements in USV (uninterruptible power supply) installations, solar installations or wind generator installations, according to the preamble to claim 1.

2. History of Related Art

The invention is further described below in the example of rechargeable batteries, to which belong especially the lead-acid batteries common in automobiles, and also the well known NiCd elements, without the invention being restricted to these two types of battery.

The power capability of a battery of the type quoted is, for a given nominal capacity, chiefly dependent on its charge condition, the type and number of the previous charging cycles and strongly on its operating temperature. In ground conveyor vehicles, for instance fork lift trucks, and in sailing boats, the recharging of the battery is required in the shortest possible charging cycles and at the maximum charging current. In order not to shorten the lifetime of the battery, the so-called gas potential must not be exceeded. The optimum charging can only be performed in dependency on the actual battery temperature. If for instance the discharged battery is charged by too high a current in too short a time in the cold condition, its lifetime as well as its energy storing capacity is diminished. If the battery is put into service after a long interruption, as a rule neither its charge condition nor its available total capacity is known. This is a disadvantage, since in ignorance of these data a battery which is no longer sufficiently capable of performance may not be exchanged or exchanged too late.

Both in the charging and also the discharging of the battery, as well as the temperature, the currents flowing, the available terminal voltage, the instantaneous electrical power and the overall available energy are of interest: in the discharging of a battery, for instance too great a current, an unexpectedly large output, an unusually low terminal voltage or an increased temperature are indications of a short circuit. During charging a damaging overcharging can be concluded from an increased temperature.

The determination of these physical values, given as examples, which concern the battery, and their presentation on one or more indicating elements do not of themselves present any problem in principle. A considerable expense is required for this however, since for each of the values of interest, such as for instance the temperature, the current flow or the terminal voltage, an individual sensor is required. Each of these sensors must as a rule have access to its own power supply. In conventional, analog measuring systems each sensor output requires its own transmission line to the display unit. The conversion of the sensor signals into a computer conforming form, for instance in a digital presentation, the processing of this data in a computer and the transmission with the aid of the computer of determined physical values is associated with further expense, and in each case a minimum two wire data line, often of considerable length must be installed between the battery and the display unit.

SUMMARY OF THE INVENTION

The aim, which is addressed by the present invention, consists in producing a device for electrical direct current systems which can be installed in the simplest manner, and with which a multiplicity of physical values, which concern the battery, are determined and taken to one or more display units for presentation and used for the optimisation of the handling of the battery in charging and discharging.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE PREFERRED EMBODIMENTS

Figure 1:
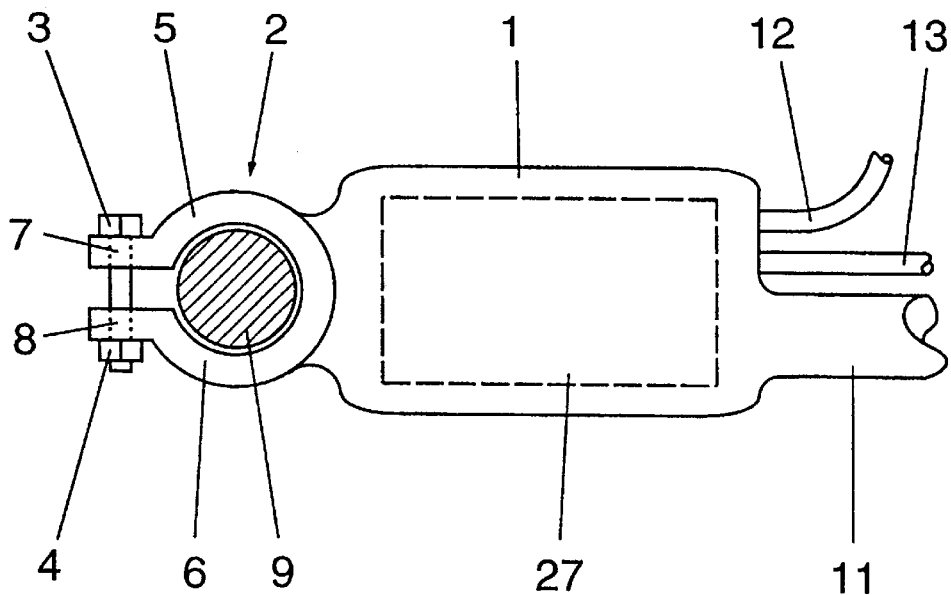
FIG. 1 the outline of a measuring battery clamp in accordance with the invention, FIG. 2 a view into the inside of a measuring battery clamp with a voltage sensor, FIG. 3 a view into the inside of the measuring battery clamp with a current sensor and a temperature sensor, FIG. 4 the block circuit diagram of an ampere-hour sensor, FIG. 5 the schematic representation of a circuit of the measuring battery clamp.

The outline of a measuring battery clamp in accordance with the invention is shown in FIG. 1. It has on one side a known fastening sleeve 2 of metal, with which the measuring battery clamp 1 can be firmly fastened to one of the two terminals of a battery, either to the positive pole connection 9 or to the negative pole connection 47 (not shown). The fastening sleeve contains for instance two half-circular formed straps 5, 6, each with a hole 7, 8. The fastening sleeve 2 is pushed over one of the pole connections 9, 47 and, using a screw 3 passing through the holes 7, 8, is pulled against a nut 4, whereby a good electrical and thermal conducting, firm connection results between this pole connection 9, 47 and the measuring battery clamp 1.

In the first modification shown in FIG. 1, the fastening sleeve extends into a thickening of the same piece of electrically conducting metal, which contains a hollow space 27 within it. After this hollow space 27 the fastening sleeve 2 again tapers and then passes into a battery cable 11, with which it is joined in a firm and electrically conductive, known manner. An insulated battery cable 12 leads into the hollow space 27, which is connected to the other, here then the negative, pole of the battery. An insulated data line 13 leads out from the hollow space 27.

In a second modification the fastening sleeve 2 is firmly fixed to one side of a case 10 and extends partly into this. On another side of the case 10 three electrical lines lead away, which are firmly fixed to the case 10, namely a battery cable 11, a battery cable 12, which is connected to the other battery pole, here then the negative pole connection of the battery, as well as a data line 13.

For the sake of simplicity, in the further description of this second modification is assumed, whereby however the first modification is always included in the meaning.

Figure 2:
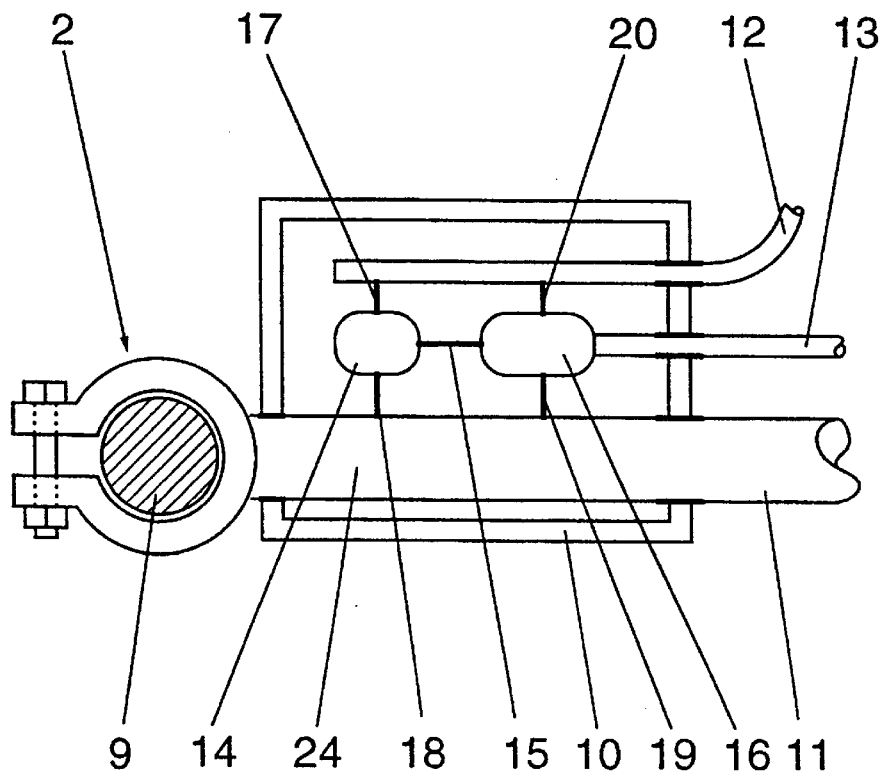
Figure 3:
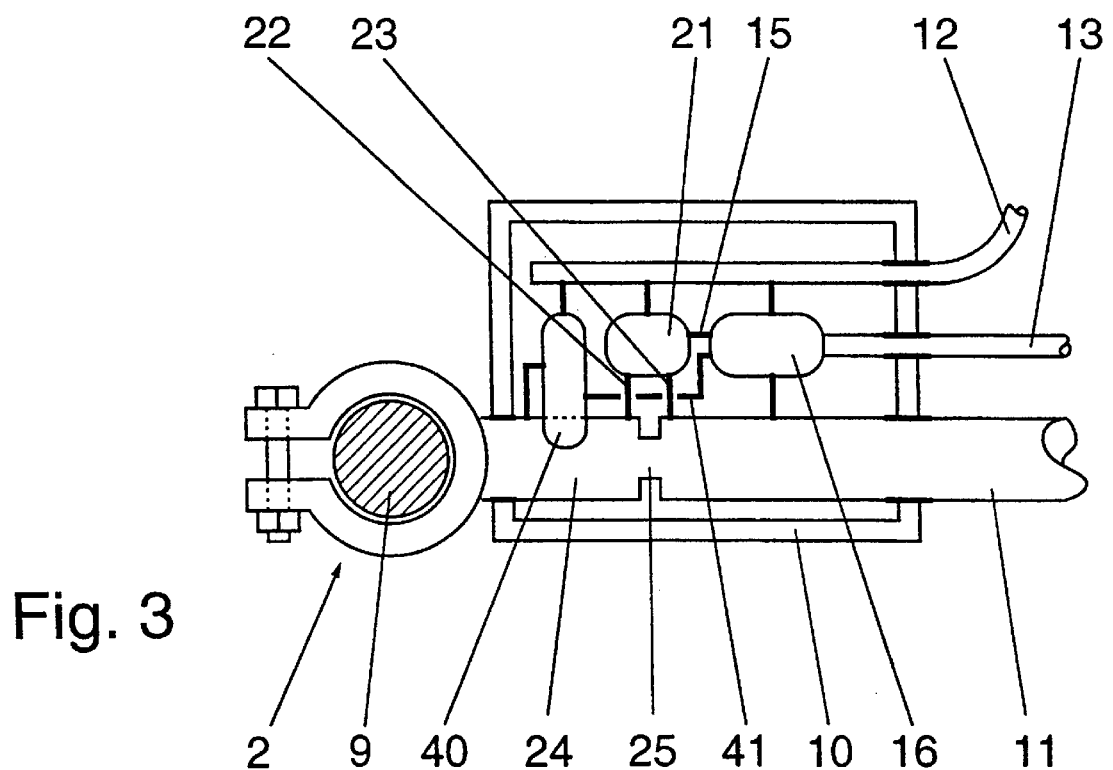

In FIG. 2 and FIG. 3 the hollow space 27 is shown without a covering surface to the case 10, so that the view of the inside is open. This is covered in operation and thereby protected from aggressive fluids and gases. A greater protection can further be achieved if the case 10, and the hollow space 27, together with the components present therein, is filled with an insulating and hard setting material, for instance a plastics resin. The interior includes at least one sensor and means of signal processing, which are further described using the two following figures.

FIG. 2 shows, in the interior of the measuring battery clamp 1, a first sensor 14 for the measurement of battery voltage. It is electrically connected both with the battery cable 12 and also with a part 24 of the fastening sleeve 2, extending into the case 10, which is at the positive potential of the battery, via conducting connections 17, 18. This sensor 14 measures the terminal voltage U of the battery, for which various processes are generally known. It is joined by an electrical connecting link 15 with a signal processing unit 16, which is also present within the interior of the case 10. This includes an electrical output, which is connected to the data line 13 leading out from the case 10. The supply of electrical energy to the signal processing unit is similarly effected directly via further connections 19, 20 to the two battery cables 11, 12.

FIG. 3 shows, in the interior of the measuring battery clamp 1, a second sensor 21, with which the current I flowing out of the battery is measured, as well as a third sensor 40, with which the temperature of the battery is measured. The second sensor 21 is connected with the part 24 of the fastening sleeve 2 extending into the case 10 via a conducting link 22. The part 24 is for its part connected via a low resistance shunt resistor 25 with electrical resistance value R/ with the battery cable 11, which leads our of the case 10. The sensor 21 is also connected via a further electrical link 23 with the outward leading battery cable 11. If a current I flows through the battery cable 11, a voltage $U^*=R^*I$, is built up proportional to it across the shunt resistor 25. This voltage $U^*$ is measured by the sensor 21 and a signal results, which is proportional to the electrical current I flowing out of the battery. This signal is similarly taken using the means also here and mentioned already in the description of FIG. 2 to a signal processing unit 16, processed therein and transmitted in a form suitable for passing to an indicator unit to the data line 13.

This type of current measurement is unavoidably associated with a certain loss of power. In three modifications the use of a shunt resistor 25 is dispensed with in the measurement of the current I, and instead of this a dissipation-less current measurement is performed. For this, the magnetic field is measured, which at a given position in the vicinity of the positive battery cable is proportional to the current flowing in it. Sensors for this type of current measurement are generally known, for instance from the Special Volume Nr. 246 of "Elektronik" (Sensoren II, p. 69 f., Henri Hencke: Halleffekt und Permalloy-Stromsensoren). In a first modification a permalloy current sensor is applied for current measurement. In a second modification direct measurement of the Hall effect voltage is performed in a Hall sensor. In a third modification the Hall voltage generated in the sensor is compensated to zero, whereby an increased accuracy of current measurement is achieved. Suitable sensors for these three modifications are manufactured industrially and are available to the developer in various versions, optionally with analog or digital output.

In this embodiment the inner part 24 of the fastening sleeve 2 includes the temperature sensor 40 mentioned, which is in close thermal contact with the fastening sleeve 2. Since this is itself similarly in good thermal contact with the pole connector 9 of the battery, it has also essentially the same temperature as the battery itself. For the measurement of temperature various methods are generally known, for instance PTC or NTC resistors, PT resistors, thermoelements, SI sensors or special temperature-dependent oscillating quartz crystals with a strongly temperature-dependent frequency. The sensor 40 is in electrical contact with a further input to the signal processing unit 16 via a connecting link 41.

The power supply to the current sensor 21 and the temperature sensor 40 is effected in an analog fashion to that of the first sensor 14 via connections 17, 18 and 19, 20, which here, however, for the sake of clarity, are no longer designated especially with numbers.

It is then immediately possible, sensible and similarly in accordance with the invention, to hit upon any desired selection from the sensors suggested and to house them in the case 10. The signal processing unit 16 has then a corresponding number of inputs and a correspondingly greater capacity. It is similarly in accordance with the invention, that the signal processing unit 16 has an analog or digital multiplier for the calculation of the product of two measured values. Thereby for instance it is already possible to calculate the instantaneous power P of the battery in the signal processing unit 16 as the product of current I and terminal voltage U, to put the result on the data line 13 and take it to an indicator. It is similarly in accordance with the invention, however, to transmit the values for current I and terminal voltage U immediately, for instance to an indicator board, and to place the hardware for the multiplication of these two values in the vicinity of this indicator board.

In two further modifications of the measuring battery clamp in accordance with the invention, it includes means for determining the amount of charge in the battery. The arrangement for this operates as a so-called ampere-hour counter, and indeed both during charging and also, with reversed prefix during the discharging of the battery.

In the first of these modifications a time meter as well as a current sensor is additionally available in the case 10. Suitable elements are generally known. They include as a rule a quartz oscillator to generate a time unit, which is converted by electronic frequency division into larger time units. Due to the small volume of such elements it is possible without problem similarly to build them into the case 10 of the measuring battery clamp 1. If there is in any case already a time meter available in the signal processing unit 16, for instance the system clock of a microprocessor, this time meter can be used directly. A signal proportional to the current flow I is integrated numerically over time with the aid of the time meter. The signal processing unit 16 can include a microprocessor additionally for this, which integrates the current flow I numerically over time. The result, the charge still present in the battery, is then transmitted in the manner already described above on the data line 13.

The integration of the current over time can obviously be effected also using means which are positioned outside the case 10, about which no further description needs to be given here.

Figure 4:
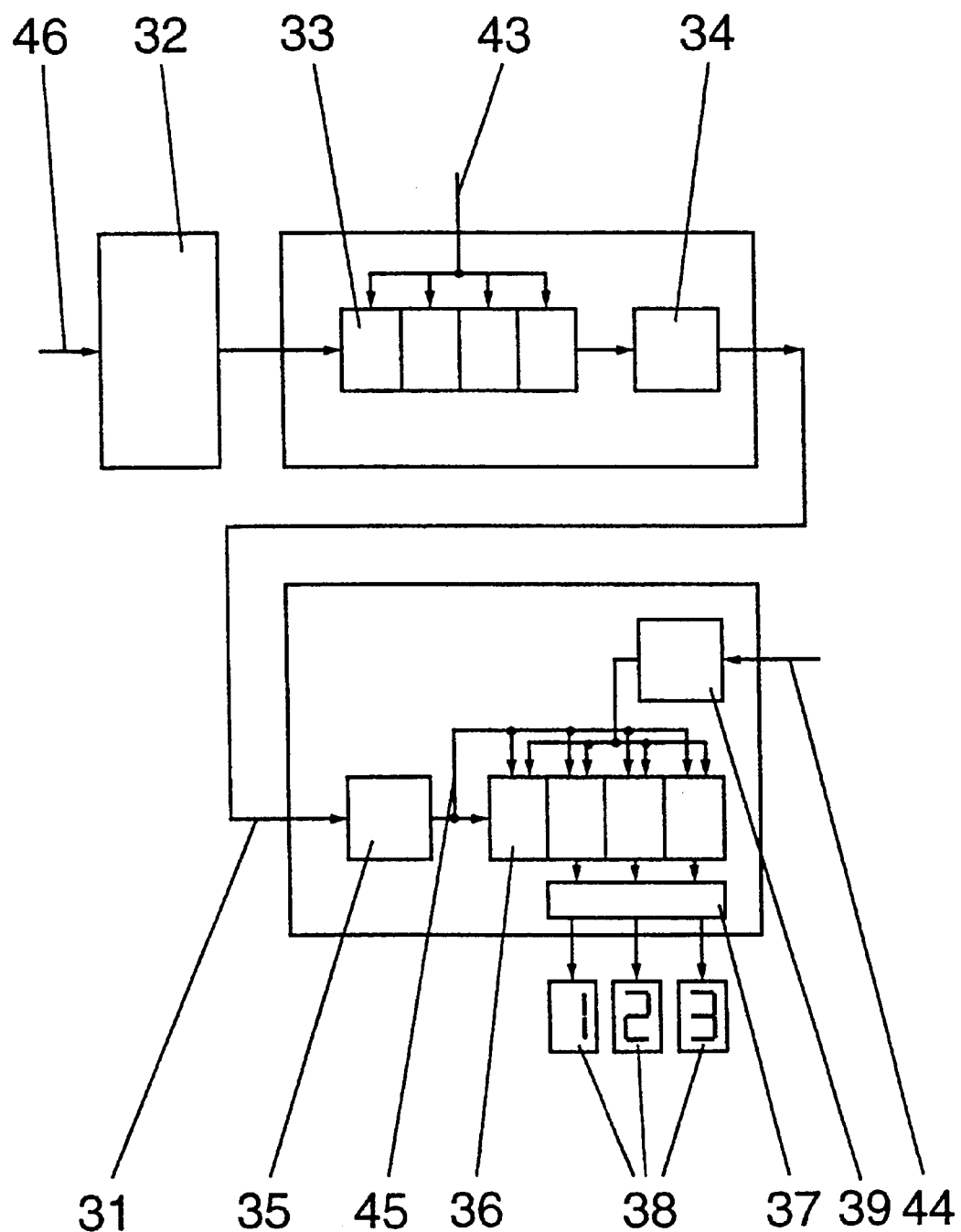

The second modification for determining the amount of charge is explained using FIG. 4. Here a voltage $U^*$, proportional to the current flow is first determined using one of the known methods of measurement. This voltage $U^*$ is taken to the input 46 of a voltage to frequency converter (V/F Converter) 32, present in the case 10. Its output is a square-wave signal with a frequency f proportional to the current I. The number of the periods is counted in a known forwards-backwards counter (binary-coded decimal counter, BCD Counter) or binary counter 33 with for instance 4 places. The forwards-backwards counter 33 has a prefix input 43. At this input, according to the known state of the art, the counter is told the direction of the current flow, that is whether charging or discharging is occurring. Thereby the forwards-backwards counter 33 counts upwards during the charging phase and downwards during the discharging phase. The output of the forwards-backwards counter 33 is connected to the input of a multiplexer, for instance a bus transceiver 34. After for instance 10,000 periods a transmission signal becomes active, which is transmitted to the bus transceiver 34, which passes this bit via the data line 31 to a further bus transceiver 35 in the indicator unit 28, 29. The output of this bus transceiver 35 is connected to the inputs of a further forwards-backwards counter 36. A further data bit, which is transmitted serially over the same data line 31, establishes in the forwards-backwards counter 36 via its prefix input 45, whether the forwards-backwards counter 36 counts upwards or downwards. The values of the $10^{th}$, $100^{th}$, and $1000^{th}$ positions are taken to a 7 segment decoder 37, which displays them, for instance on a 3 place LCD indicator 38. Obviously, any other coding or display technology can be used. With the aid of a reset switch 39, close to the display a reset signal 44 can be entered manually, for instance via a press switch. This allows the user at any time to start a new integration phase as required.

The ampere-hour count, which is calculated and displayed in this manner, is an important measure for the charge condition of the battery, somewhat comparable to the display of a petrol gauge in a petrol-driven motor vehicle.

A substantially greater installation cost would be necessary, if for each individual value of a multiplicity of physical quantities an individual separate data line 13 had to be taken to one or more than one separate indicator units 28, 29. The simplification in accordance with the invention comprises both in that sensors 14, 21, 40 and a processing unit 16 are concentrated in the battery clamp 1 itself, and also that the measured values are transmitted over a single two-wire data line 13 serially. The data line can also be a single wire, if an earth connection is available overall, as is for instance the case in an automobile body. Serial transmission requires a suitable and miniaturised multiplexer and bus system with bus transceivers 34 and 35. Such systems belong, in the most diverse versions to the known state of the art, for instance according to CH 1997 2671/97.

Figure 5:
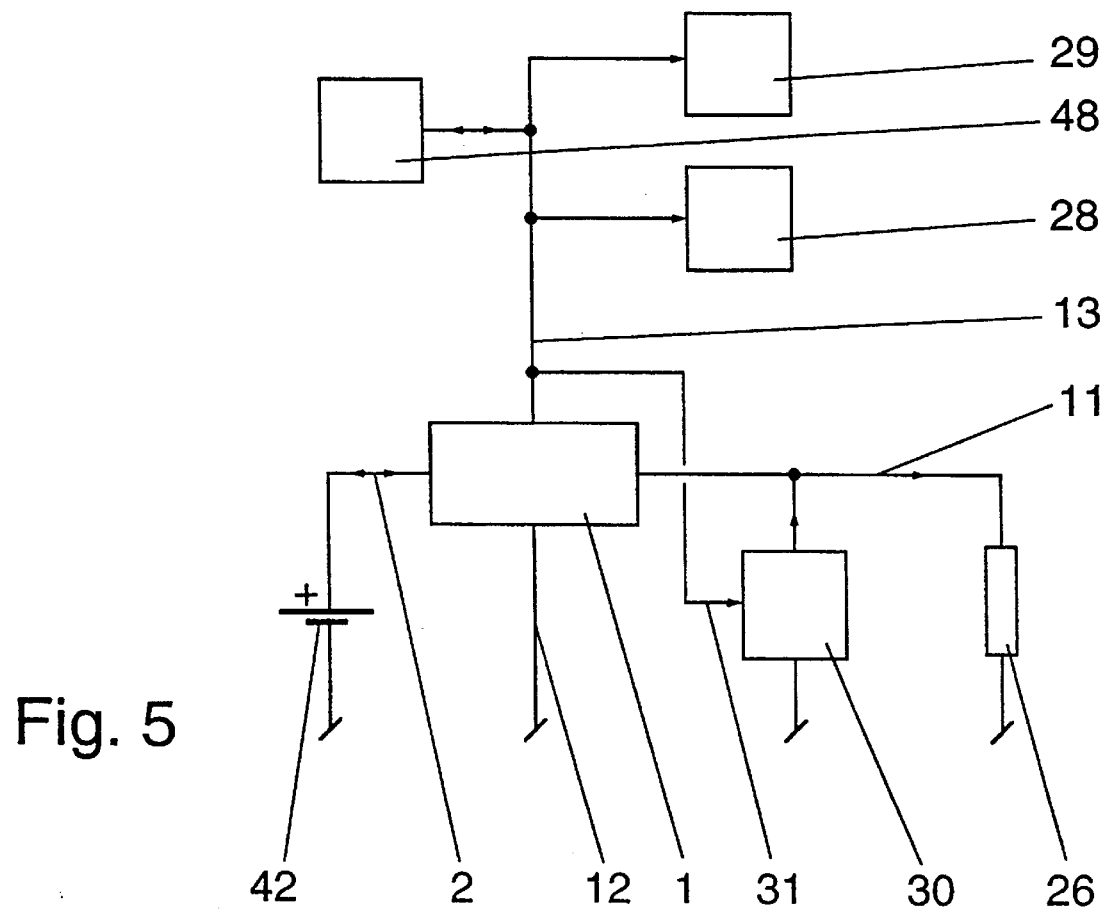

In FIG. 5 an electrical direct current system in accordance with the invention is shown schematically. This could be for instance the electrical direct current system of an air, land or water vehicle. The positive pole connector 9 of a battery 42 is connected to the measuring battery clamp via the fastening sleeve 2. The battery cable 11 leads out of the case 10 of the measuring battery clamp 1 and is, possibly interrupted by switches, which are not drawn in, connected to the resistance 26, which represents the total resistance of all the connected energy loads. From the case 10 leads also the data line 13, which is connected to one or more than one indicator unit 28, 29. An energy source 30, for instance a charger, an alternator, a solar panel, a wind generator or similar is similarly connected to both battery cables 11, 12. The energy source 30 is connected by a further data line 31 with the data line 13. It includes further means, not shown, for the processing of the battery data and for the corresponding control of the charging current. The case 10 of the measuring battery clamp 1 includes at least one sensor 14, 21, 40, for instance for the current I, for the terminal voltage U or for the temperature. The signal processing unit 16 includes a multiplexer, for instance a bus transceiver 34, and typically also an integrator as well as a multiplier. The bus transceiver 34 includes a multiplicity of inputs and makes it possible to pass on a multiplicity of different data serially one after the other to targeted defined destinations, for instance to indicator elements 28, 29 via a single two-wire data line 13 or 31, and via the data line 31 also to the energy source 30. With the aid of this data transmitted to the energy source 30 the charging current, matched to the status data of the battery, can be optimised precisely, whereby the total lifetime of the battery can be substantially extended.

In a modification the whole system is connected via the data line 13 to a higher ranking computer 48, which discharges the most varied other tasks. From the direct current system data are delivered on the one hand to the computer 48, which for instance captures them, lists and archives them. On the other hand control data are transmitted from the computer 48 to the direct current system, with which for instance remote control tasks are fulfilled, target values laid down, new integration phases of the ampere-hour counter started or communication with other external systems or networks performed. The connection can be designed for one-way transmission, that is transmission only in the one or only in the other direction, or indeed for alternating transmission in both directions.

What is claimed is:

1. An electrical direct current system comprising:

a rechargeable battery having a first pole connector and a second pole connector, said first pole connector and second pole connector having different polarity;

a first battery cable communicating said first pole connector with one or more loads;

a second battery cable communicating said second pole connector with one or more loads;

a first connecting clamp having a first fastening sleeve of metal that is in contact with said first pole connector of said battery, whereby said first battery cable is joined to and is thermally and electrically conducting with said first fastening sleeve;

a second connecting clamp having a second fastening sleeve of metal that is in contact with said second pole connector of said battery, whereby said second battery cable is joined to and is thermally and electrically conducting with said second fastening sleeve;

wherein at least one of said first connecting clamp and said second connecting clamp is a measuring battery clamp, which includes a current sensor and a signal processing unit with an electrical output;

wherein said measuring battery clamp includes at least one second sensor with an output, wherein said second sensor delivers an electrical signal;

said signal processing unit having an electrical input for each of said at least one second sensors and said current sensor wherein said at least one of said second sensors and said current sensor is electrically connected to an output of a corresponding sensor selected from a group consisting of said at least one of said second sensors and said current sensor;

wherein said output is a data line, which makes an electrical connection to said output of said signal processing unit, said electrical connection leading out from an interior of said measuring battery clamp;

wherein said signal processing unit includes a processing means, whereby said processing means may determine the value of at least one physical quantity concerning said battery from a current and from a totality of signals transmitted to said signal processing unit from said at least one of said second sensors and said current sensor that are present; and wherein said signal processing unit includes means for converting said at least one physical quantity into a suitable form and for passing onto said data line for onward transmission.

2. An electrical direct current system according to claim 1, wherein:
said interior of said measuring battery clamp is defined by a hollow space in a thick portion of said connecting clamp;
wherein, said hollow space defines an essentially gas and fluid tight enclosure.

3. An electrical direct current system according to claim 1 wherein:
said interior of said measuring battery clamp is formed and limited by a case that is connected to said fastening sleeve;
wherein said case defines an essentially gas and fluid tight enclosure.

4. An electrical direct current system according to claim 1, wherein:
energy supplied to said at least one of said second sensors and said current sensor and said signal processing unit is provided via an insulated battery cable that leads into the interior of the measuring battery clamp, wherein said measuring battery clamp is connected to said first pole connection; and
said insulated battery cable is in electrical communication to said second pole connection of the battery.

5. An electrical direct current system according to claim 1 further comprising:
a low resistance shunt resistor between said fastening sleeve and said first battery cable; and wherein
said current sensor delivers a signal that corresponds to a voltage across said shunt resistor, wherein said signal is proportional to a current flow (I).

6. An electrical direct current system according to claim 1, wherein:
said current sensor includes a resistor comprised of Permalloy fixed in the immediate vicinity of current flow (I); and
said current sensor delivers a signal, which results from the dependency of the electrical resistance of said Permalloy on a strength of a magnetic field, wherein said signal is proportional to said current flow (I).

7. An electrical direct current system according to claim 1, wherein:
said current sensor includes a Hall-probe fixed in a vicinity of a current flow (I);
said current sensor delivers a signal that corresponds to a Hall voltage proportional to a strength of a magnetic field, wherein said signal is proportional to the current flow (I).

8. An electrical direct current system according to claim 1, wherein:
said current sensor includes a Hall-probe fixed in a vicinity of a current flow (I);
wherein said Hall probe generates a Hall voltage that is proportional to a strength of a magnetic field that is proportional to said current flow (I); and further comprising:
a compensating circuit for generating a compensating voltage, with which said Hall voltage can be compensated to zero; and
said current sensor delivers a signal, that corresponds to said compensating voltage.

9. An electrical direct current system according to claim 1, wherein:
said measuring battery clamp additionally includes a sensor in said interior of said measuring battery clamp for sensing a terminal voltage (U);
said signal processing unit includes means for multiplying two physical quantities for calculating a product of the terminal voltage (U) and the current (I); and
wherein said product can be transferred by said signal processing unit to said data line for onward transmission.

10. An electrical direct current system according to claim 1, wherein:
said measuring battery clamp includes a time meter in said interior of said measuring battery clamp;
said signal processing unit includes a microprocessor for calculating an integral of a physical quantity over time, the microprocessor approximating an integral of a current (I) over time by summing a multiplicity of products of discrete measurements of the current (I) between certain time intervals and an individual time interval; and
wherein said integral can be transferred by the signal processing unit to the data line for onward transmission.

11. An electrical direct current system according to claim 1, wherein:
said measuring battery clamp includes means in said interior of said measuring battery clamp for an integration of a physical quantity over time;
said means for integration including a voltage to frequency converter and an electronic forwards-backwards counter;
said output of said current sensor is connected to an input of the voltage to frequency converter;
an output of the voltage to frequency converter is connected to an input of the forwards-backwards counter;
a frequency proportional to a current (I) from the frequency converter is passed to the forwards-backwards counter with a positive prefix during charging of the battery, with a negative prefix during discharge, for counting;
the output of the forwards-backwards counter is connected to an input of the signal processing unit; and
an integral of current flow over time is determined by the signal processing unit and can be passed for onward transmission to at least one indicator unit.

12. An electrical direct current system according to claim 1, wherein:
a means of output from the signal processing unit includes a bus transceiver;
said bus transceiver is connected to the data line leading out from the measuring battery clamp;
the data line is two-wire at maximum; and
a second bus transceiver is present at each of at least one receiver of incoming data on the data line.

13. An electrical direct current system according to any one of the claims 1 to 12 inclusive, wherein:
the measuring battery clamp includes a temperature sensor in said interior of said measuring battery clamp; and further comprising:
electronic control means that are connected to an energy supply source;
the electronic control means are connected via a second data line to the data line of the measuring battery clamp;

a control means for accepting data from the data line;

said control means for limiting a charging current from the energy source to the battery to an optimal value that is dependent on a temperature of the battery so as not to exceed said optimal value.

14. An electrical direct current system according to any one of the claims 1 to 12 inclusive, wherein:

at least one indicator unit is present for displaying values of physical quantities;

each of the indicator units is connected to the data line; and control means are available in each of the indicator units for accepting and displaying data from the data line.

15. An electrical direct current system according to claim 1, further comprising:

a higher ranking computer;

said computer connected via the data line to the direct current system; and wherein data can be transmitted via the data line between the computer and the direct current system in at least one direction.

* * * * *

UNITED STATES PATENT AND TRADEMARK OFFICE
CERTIFICATE OF CORRECTION

PATENT NO. : 6,218,805 B1
DATED : April 17, 2001
INVENTOR(S) : Domenic Melcher

Page 1 of 1

It is certified that error appears in the above-identified patent and that said Letters Patent is hereby corrected as shown below:

Column 1,
Line 11, delete "according to the preamble to Claim 1"

Signed and Sealed this

Twenty-fifth Day of December, 2001

Attest:

Attesting Officer

JAMES E. ROGAN
Director of the United States Patent and Trademark Office